United States Patent [19]
Dudderar et al.

[11] Patent Number: 5,966,903
[45] Date of Patent: Oct. 19, 1999

[54] HIGH SPEED FLIP-CHIP DISPENSING

[75] Inventors: Thomas Dixon Dudderar, Chatham, N.J.; Charles Gutentag, Los Angeles, Calif.

[73] Assignee: Lucent Technologies Inc., Murray Hill, N.J.

[21] Appl. No.: 09/085,643

[22] Filed: May 27, 1998

[51] Int. Cl.⁶ .......................... B65B 11/00; B65B 21/02; B65H 5/28

[52] U.S. Cl. .................. 53/397; 414/416; 29/743; 221/74

[58] Field of Search ................ 53/397; 414/416; 156/584; 29/743, 827; 221/70–74

[56] References Cited

U.S. PATENT DOCUMENTS

| | | | |
|---|---|---|---|
| 4,494,902 | 1/1985 | Kuppens et al. | 221/74 |
| 5,203,143 | 4/1993 | Gutentag | 53/452 |
| 5,319,846 | 6/1994 | Takahashi et al. | 414/416 |

FOREIGN PATENT DOCUMENTS

| | | | |
|---|---|---|---|
| 4-25100 | 1/1992 | Japan | 29/743 |
| 5-32217 | 2/1993 | Japan | 53/397 |
| 5-132021 | 5/1993 | Japan | 53/397 |

*Primary Examiner*—Peter Vo
*Assistant Examiner*—Matthew Luby

[57] ABSTRACT

The specification describes a method for dispensing IC chips from a chip carrier tape for a flip-chip assembly operation. In a conventional assembly operation, the solder bumped side of the chip is the top side of the chip as loaded on the tape, and is normally the side of the chip that engages the head of the pick tool. For flip-chip assembly it is necessary to invert the chip for solder bonding to an interconnect substrate. In the technique of the invention, the chip carrier tape is inverted and inserted into the dispensing machine upside down. The IC chips are then ejected through the back of the tape instead of being lifted from the from of the tape. In this way the pick tool head engages the back side of the solder bumped chip and the chip is in the proper orientation for flip-chip placement and bonding on the interconnect substrate.

3 Claims, 4 Drawing Sheets

HIGH SPEED FLIP-CHIP DISPENSING

FIELD OF THE INVENTION

This invention relates to techniques and related apparatus for semiconductor chip handling and more specifically to methods for transferring chips from chip carrier tapes to other processing stations.

BACKGROUND OF THE INVENTION

A variety of systems for conveying finished integrated circuit (IC) chips from the IC singulation operation to the IC packaging operation are available commercially. Many of these systems use an apertured tape with an adhesive backing as more particularly described in Industry Standard, EIA/IS-747, published by the Electronic Industries Association, Arlington, Va. Chips are mounted in the apertures with a pick and place tool, and are retained in the apertures by the adhesive tape backing. A widely used carrier tape system uses two parallel rails of adhesive tape which extend along the underside of apertured tape. See, e.g. U.S. Pat. No. 5,203,143, issued Apr. 20, 1993. After the carrier tapes are loaded, the tapes can be conveyed directly to the next assembly operation, or more typically, are reeled for temporary storage. Tapes are then unreeled and the chips are picked from the adhesive carrier tape to be placed in a package assembly machine. With conventional pick and place tools the chips, which are carried circuit side up on the adhesive carrier tape, are seized on the circuit side by the vacuum head of the pick and place machine, and inserted circuit side tip in the next assembly station. For normal surface mount and wire bonded packages the circuit side tip position of the chip is the orientation desired. However, for flip-chip packages, this orientation is upside down.

Various methods have been employed to adapt adhesive carrier tape systems for flip-chip packaging. One of these is the Bare Die Dispensing System available from Tempo Electronics, Los Angeles, Calif. In this equipment, an inverter arm is used to pick the die from the carrier tape in the usual way, i.e. circuit side up, swing the arm of the pick tool through a 180° arc, then pick the die with a second pick tool from the first pick tool, this time with the circuit side down. While this method is satisfactory, the use of two pick operations slows the chip handling operation and contributes error to chip position repeatability at the pick point. Other solutions for adapting carrier tape systems to flip-chip packaging are needed.

SUMMARY OF THE INVENTION

We have designed a carrier tape system for flip-chip assembly where the chip can be loaded on the carrier tape circuit side tip in the usual manner, and can be picked from the carrier tape and placed circuit side down in a single pick operation. The system uses essentially the same equipment used in the conventional arrangement and uses essentially the same carrier tape. The modification, according to the invention, is to pick the chip from the back side of the carrier tape. The vacuum head of the pick tool then contacts the back side of the IC chip, and can dispense the chip circuit side down without any additional handling.

DETAILED DESCRIPTION

Figure 1:
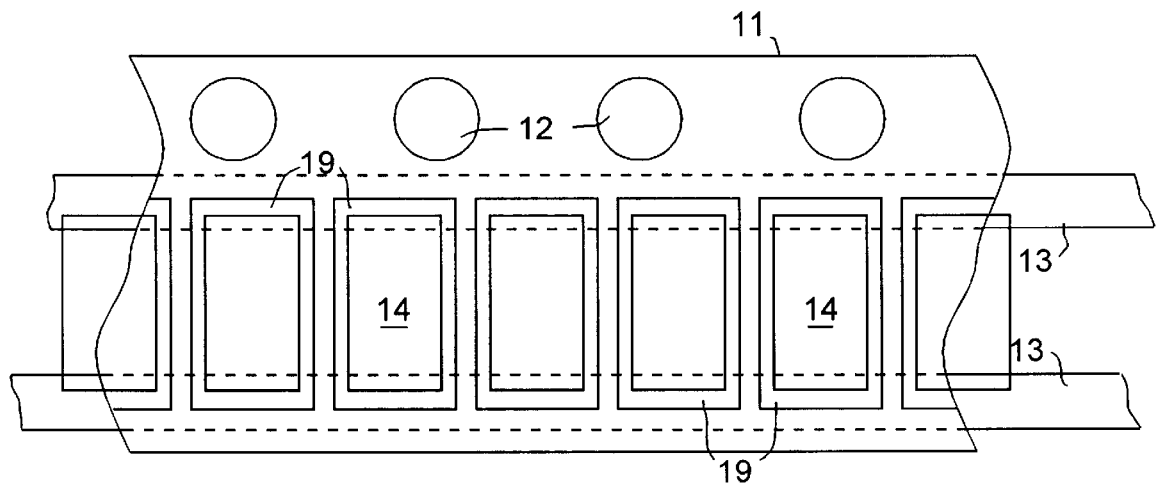
FIG. 1 is a schematic plan view of an adhesive backed punched plastic carrier tape.

Referring to FIG. 1 an adhesive backed punched plastic carrier tape is shown at 11 with sprocket holes 12 for controllably reeling the tape through the dispensing apparatus. The sprocket holes also serve as alignment means for coordinating the movement of the tape and the pick and place tools. The chip sites are shown at 19 which are simply openings through the carrier tape 11. The IC chips are shown at 14, and rest on the adhesive tape rails 13. The rails 13 are coated on the chip side of the rails with a low adhesion polymer to retain the chips in place. The adhesive tape can be any of a variety of flexible tapes. A well known example is Nitto tape which is widely used in the industry. The carrier tape can be any suitable thick flexible high strength material. An example is SurfTape® manufactured by Tempo Electronics, Los Angeles, Calif.

In a typical chip manufacturing operation, the processed wafers are singtulated in a dicing machine and the individual chips are placed in a carrier tape 11 as shown in FIG. 1. The tapes may be conveyed as a conveyer belt to a subsequent processing station but are more typically reeled and the reel is taken to the first packaging station. Here the individual chips are dispensed from the tape by a pick and place tool and placed in a die bonder or mounted on an interconnect substrate for solder bonding. In the example shown in FIGS. 2–4 the chips 14 are solder bumped with solder bumps 15, and readly for surface mounting on an interconnect substrate.

Figure 2:
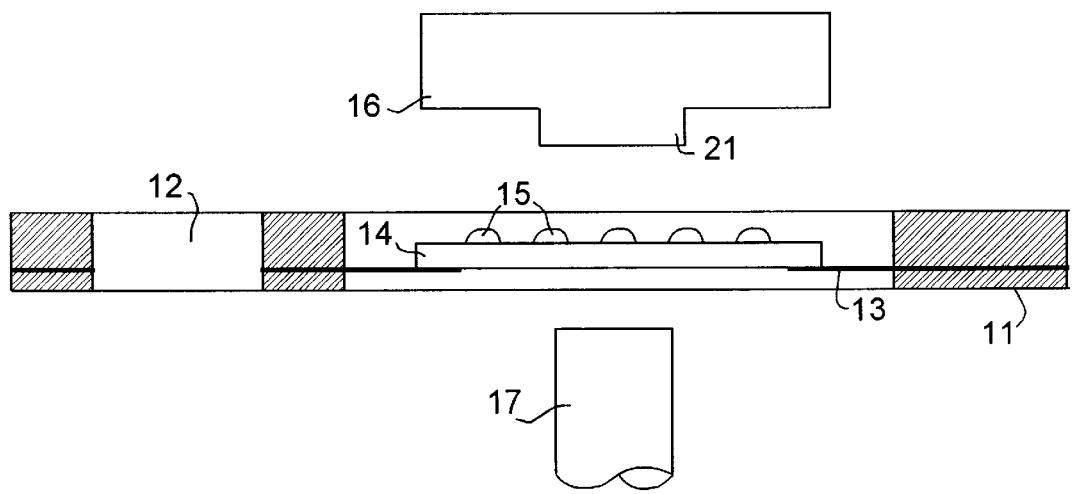
FIGS. 2–4 are a schematic representations of the conventional sequence of operations for dispensing IC chips from an adhesive backed plastic carrier tape.
Figure 3:
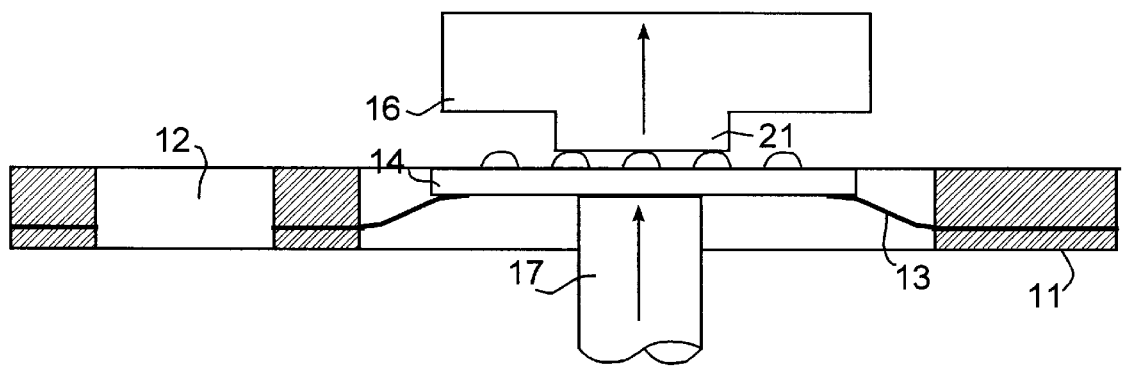
Figure 4:
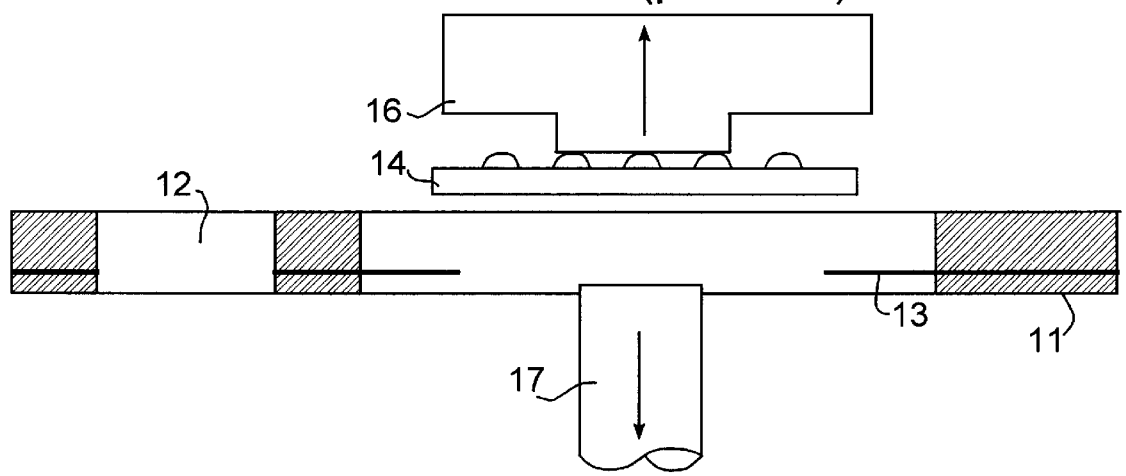

The typical dispensing operation is shown in FIGS. 2–4, where the unreeled tape 11 is stepped through a dispensing apparatus and the individual die 14 are picked from the tape carrier 11 by the pick and place tool 16. The pick and place tool is conventional and typically consists of a vacuum head 21 attached to a micromanipulator arm that picks the chips from the carrier tape and places them on the package substrate (not shown). The dispensing operation is enabled with the use of a die ejector pin 17, which as shown in FIG. 3, lifts the chip 14 from the adhesive tape 13 to engage the vacuum head 21 of the pick and place tool 16. The tape is stepped into position for this operation by sprockets that engage the sprocket holes 12. The operation of the pick and place tool, the die ejector pin, and the movement of the tape carrier, are coordinated in a manner that allows chips to be dispensed at a rate of several per second. The timing of the operation of the die ejector pin and the vacuum head are such that the tape peels from the back of the chip as shown in FIG. 3, prior to raising the vacuum head, so that twisting or rotation of the chip is minimized. FIG. 4 shows the dispensing operation completed, and the chip ready to be moved to the placement site.

The foregoing operation is used successfully in a variety of chip handling applications. However, complications arise when the dispensing apparatus is used in a flip-chip assembly operation. This is due to the fact that for a flip-chip package the chip arrives at the pick and place tool 16 active side up, and must be inverted prior to placement on the interconnect substrate. Apparatus is available for inverting the chip prior to the pick and place operation but that apparatus essentially involves an additional pick and place tool, which as mentioned earlier adds complexity to the operation and, more importantly, reduces accuracy and significantly slows the overall operation.

Figure 5:
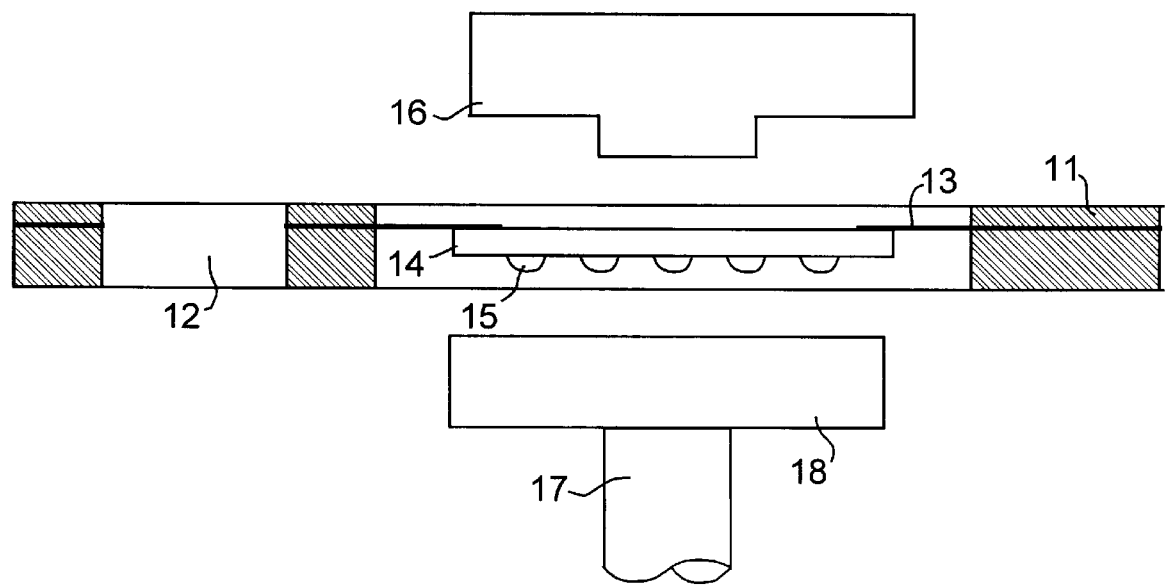
FIGS. 5–8 are schematic representations of the sequence of the invention for dispensing IC chips from the back side of an adhesive backed plastic carrier tape.
Figure 6:
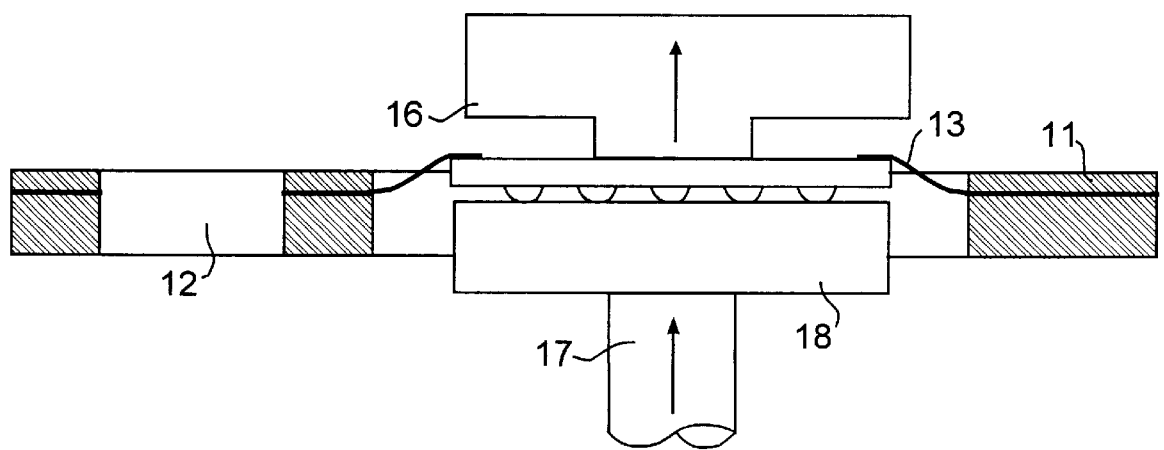
Figure 7:
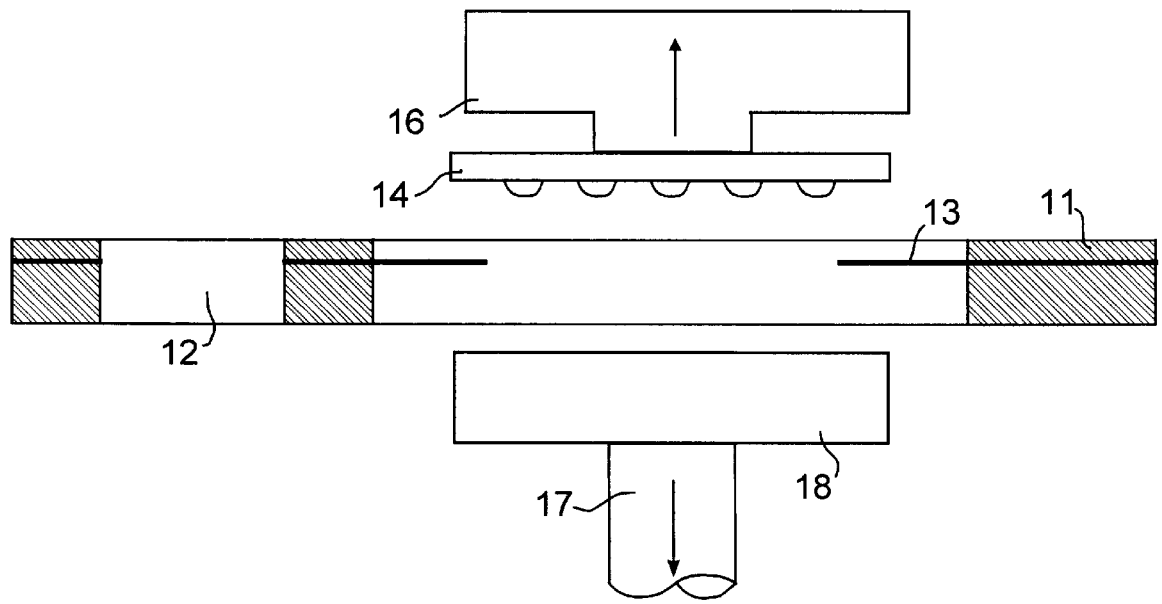

The modification of the dispensing operation according to the invention is shown in FIGS. 5–7. The essential feature of this modified dispensing operation is that the tape and the pick tool are oriented so that the active side of the chips are facing the vacuum head of the pick tool. Since the chips are loaded onto the tape at the singulation stage with the active side up, i.e. the back of the chip contacts the adhesive rails 13, either the tape or the vacuum head must be inverted with respect to each other. In the embodiment shown in FIGS. 5–7, the carrier tape is inverted and inserted "upside down" into the dispensing apparatus. This can be achieved following one of several options. The tape can be reeled "backwards" from the singtulation operation. The tape can be re-reeled to reverse the tape. Or the tape can be inverted in the dispensing equipment. Yet another option is to exchange the position of the pick and place vacuum head and the die ejector pin in the configuration shown in FIG. 5, and use the tape in the conventional orientation. In this mode the die ejector pin pushes from the top and the vacuum head picks from the bottom. The pick and place tool is then rotated 180° to place the chip. Rotating the vacuum head is relatively simple and rapid compared with interjecting an additional pick and place operation as in the prior art approach.

Following any of these options, the tape is stepped to the dispensing station with the tape oriented upside down with respect to the ejector pin and pick tool. The essence of the invention is the recognition that the chip can be pushed through the bottom of the tape carrier rather than lifted from the top. This is shown in FIG. 5 where the ejector pin 17 and the chip 14 are on the same side of the adhesive rails 13, and the ejector pin engages the active side of the chip 14 rather than the back side as in FIGS. 2–4. Since the ejector pin is incident on the circuit side of the chip it is preferred in this arrangement for the ejector pin to be provided with a pad 18 to reduce the risk of damage to the IC and to inhibit rotational movement of the die during release from the adhesive tape rails. Typical IC chips at this stage in the fabrication sequence have a protective coating of SINCAPS or polyimide covering the surface of the IC metallization in part to reduce the incidence of damage in handling and packaging. However, the additional precaution of padding the ejector tip may be taken.

The dispensing sequence of the invention is continued in FIG. 6 wherein the chip 14 is shown being pushed through the bottom of the carrier tape 11. It has been demonstrated that the ejection of the chip through the adhesive rails 13 in the manner shown can be achieved reliably and rapidly. The dispensing operation is shown completed in FIG. 7, with chip 14 oriented with active side down, as required for the placement of the flip-chip on the interconnection substrate.

Figure 8:
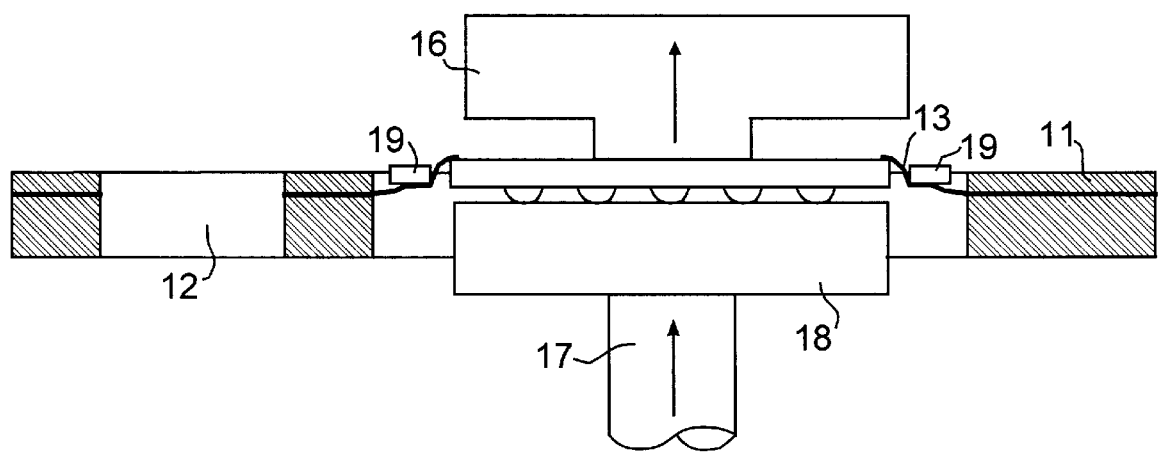

The dispensing operation of the invention may be further aided by the use of an aperture plate, as shown at 19 in FIG. 8. The aperture plate is a simple frame that is positioned as shown during lift-off of the chip 14 from the adhesive tape 13. This expedient is especially useful when the chip is relatively small, i.e. when a relatively large gap exists between the edge of the chip and the edge of the opening in the carrier tape. Other means for facilitating lift-off may also be found helpful. For example, the tape edges can be serrated or slit. Also, the back of the chips may be roughened to decrease the adhesive force between the tape and the chip.

Reference herein to solder bumps and solder bumped chips refers to the use of solder interconnections of any form or configuration, e.g. balls, paste etc.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A method for handling and dispensing IC chips using a chip carrier tape, said IC chips having a back side and a front side, with solder bumps on said front side, comprising the steps of:
   a. placing said IC chips in chip site openings on said chip carrier tape, said chip carrier tape comprising a flexible tape with a front side and a back side, with chip site openings extending through said chip carrier tape, said chip site openings having two flexible adhesive tape runners extending along the back side of the chip carrier tape, and partially covering the back side of said chip site openings,
   b. loading a plurality of solder bumped IC chips in said chip site openings with a first edge portion of the back side of said IC chips adhesively engaging one of said adhesive tape runners, and a second edge portion of the back side of said IC chips adhesively engaging the other of said adhesive tape runners,
   c. reeling said chip carrier tape,
   d. inserting said reeled chip carrier tape into a dispensing apparatus, said dispensing apparatus having a vacuum actuated pick tool head and an ejector pin spaced from said pick tool head,
   e. unreeling said chip carrier tape and moving the chip carrier tape so that said chip carrier tape traverses the space between said pick tool head and said ejector pin, with said pick tool head located on a first side of said chip carrier tape and said ejector pin located on a second side of said chip carrier tape, said first side corresponding to the back side of said chip carrier tape, and said second side corresponding to said front side of said chip carrier tape,
   f. intermittently stopping the movement of said chip carrier tape with a selected one of said plurality of IC chips in the space between said pick tool head and said ejector pin,
   f. moving said pick tool head into close proximity to the back side of said selected IC chip,
   g. moving said ejector pin to engage the front side of said selected IC chip, and to push said selected IC chip toward the front side of said chip carrier tape so as to disengage the selected IC chip from said adhesive tape runners and to engage said pick tool head.

2. The method of claim 1 in which the ejector pin is provided with a resilient polymer surface and the resilient polymer surface engages said selected IC chip.

3. The method of claim 1 further including, in conjunction with step g., positioning an aperture plate around the periphery of said IC chip in contact with said chip carrier tape.

* * * * *